US006362919B1

(12) United States Patent
Flanders

(10) Patent No.: US 6,362,919 B1
(45) Date of Patent: Mar. 26, 2002

(54) LASER SYSTEM WITH MULTI-STRIPE DIODE CHIP AND INTEGRATED BEAM COMBINER

(75) Inventor: Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 8 days.

(21) Appl. No.: 09/643,481

(22) Filed: Aug. 22, 2000

(51) Int. Cl.[7] .................................... H04J 14/02

(52) U.S. Cl. .................................... 359/497; 359/498

(58) Field of Search .................................... 372/50, 99, 103, 372/101, 6, 23; 359/130, 251, 497, 498, 124, 493

(56) References Cited

U.S. PATENT DOCUMENTS

| | | | | |
|---|---|---|---|---|
| 5,606,439 A | | 2/1997 | Wu | 349/117 |
| 6,236,666 B1 | * | 5/2001 | Mirov et al. | 372/23 |
| 6,249,364 B1 | * | 6/2001 | Martin et al. | 359/130 |
| 2001/0008463 A1 | * | 7/2001 | Cao | 359/497 |
| 2001/0028461 A1 | * | 10/2001 | Hill et al. | 356/493 |

FOREIGN PATENT DOCUMENTS

| | | | | |
|---|---|---|---|---|
| EP | 1 001 287 A2 | | 5/2000 | G02B/6/293 |
| WO | WO 91/126 | * | 8/1991 | 372/6 |
| WO | WO 91/12641 | * | 8/1991 | 372/6 |
| WO | 99/45738 | | 5/1999 | H04Q/11/00 |
| WO | 00/48029 | | 8/2000 | G02B/6/26 |
| WO | 00/48276 | | 8/2000 | H01S/5/00 |

OTHER PUBLICATIONS

Flanders, Dale C., "Submicrometer Periodicity Gratings as Artificial Anisotropics Dielectrics", Applied Physics Lett. 42 (6), Mar. 15, 1983.

Rolic Technologies, Ltd, "Linearly Photopolymerizable Polymers (LPP) and Liquid Crystal Polymers (LCP) Technology", http://www.rolic.com/technologies/LPPbody.html, Jul. 13, 2000.

* cited by examiner

*Primary Examiner*—Ricky Mack
*Assistant Examiner*—Omar Hindi
(74) *Attorney, Agent, or Firm*—J. Grant Houston

(57) ABSTRACT

A multi-stripe laser diode chip is integrated with a beam combiner on a single optical bench, and is thus, applicable to placement in a single pigtailed module. Specifically, multiple beams emitted from the chip stripes are spatially merged using a birefringent material and then coupled into an optical fiber. The use of the birefringent material provides an efficient solution for generating the merged beam, which can be coupled into a single optical fiber.

22 Claims, 4 Drawing Sheets

100
102
700
710
600
520
502
500
α
320
310
210A
210B
205
150A
150B
124
110A
110B
120
122

LASER SYSTEM WITH MULTI-STRIPE DIODE CHIP AND INTEGRATED BEAM COMBINER

BACKGROUND OF THE INVENTION

In several contexts, it is desirable to couple the optical energy from several, such as two, semiconductor laser diodes into a single optical fiber.

This combining capability is relevant to wavelength division multiplexing (WDM) applications where the laser diodes operate at different wavelengths and are modulated in response to different information signals, but couple into the same fiber.

The combining capability is also relevant in pump or other applications where power is the primary metric. In pump applications, the light from laser diodes is used to optically-pump rare-earth doped fiber or alternatively regular fiber, in a Raman pumping scheme. Multi-laser pump modules are attractive because there are limitations in the power that can be produced by a single high-power laser diode. As electrical current is increased in these lasers, the typical failure mode is catastrophic optical damage (COD) at the facet, especially in shorter wavelength laser devices such as 980 nanometer (nm) pump lasers, or excessive current densities in the ridge. Using multiple laser modules enables powers that are greater than could be generated by a single laser module.

Despite advantages, there are few commercial, integrated examples of laser systems that attempt to couple the optical energy from multiple lasers into a fiber, especially the single mode fiber that is used in most optical communication systems today. The explanation for this is the cost to manufacture—1) combining the optical energy from two lasers with bulk optics, such as beam splitter cubes, lenses, and mirrors, can more than double the module costs; and 2) the two laser diode chips double the semiconductor material costs. When these factors are accounted, the cost per Watt of the coupled power or multiplexed scheme is higher than a single laser coupled to the same fiber.

SUMMARY OF THE INVENTION

The present invention concerns a laser system utilizing multiplexed laser diodes. It uses a beam combiner that is integrated with the laser diodes on a single optical bench, and is thus, applicable to placement in a single pigtailed module. Specifically, multiple beams emitted from laser diodes are spatially merged using a birefringent material and then coupled into an optical fiber. The use of the birefringent material provides an feasible solution for generating the merged beam. The solution is most applicable, especially from a cost standpoint, to a configuration where the laser diodes are combined on a single chip with multiple, two, stripes or ridges.

In general, according to one aspect, the invention features a laser system. The system comprises an optical bench and a laser device, which is connected to the optical bench and emits multiple beams. A birefringent material, also connected to the optical bench, spatially merges the beams from the laser system. The merged beam is then coupled into an optical fiber.

In one embodiment, the laser device comprises a single chip. The chip, however, has multiple stripes or ridges, such that it is capable of generating the multiple beams. In the present embodiment, the laser diode chip has only two stripes to generate two beams.

One advantage associated with using semiconductor laser chips having multiple stripes arises from efficient utilization of the underlying semiconductor wafer material. Such dual or multi-stripe laser chips are less expensive per Watt of power generation capacity because the multi-stripe chip is not much larger in terms of wafer area than a single stripe chip because substantial wafer material area is lost to the scribe lanes required to separate chips during fabrication. With a multi-stripe laser chip, this lost material can be amortized over a larger number of the light-generating stripes.

In order for the birefringent material to perform the spatial merging function, the beams must have different polarizations with respect to each other when passing through the material, specifically linearly orthogonal polarization. Typically, when generated by one, multistripe chip, the beams will have similar polarizations with respect to the optical bench. As a result, provisions must typically be made for rotating at least some of the beams.

In the present embodiment, a polarization rotator is connected to the optical bench. It rotates a polarization of some of the multiple beams. As a result, the beams have different polarizations with respect to each other at the birefringent material.

In one implementation, the polarization rotator is a plate, such as a half-wave plate. In another implementation, the polarization rotator comprises a sub-wavelength period grating.

In the present embodiment, collimation optics is installed on the bench optically between the laser device and the birefringent material to counteract the beam divergence typical in semiconductor lasers.

Focusing optics is also preferably used, optically after the birefringent material, to focus the merged beam exiting from the birefringent material onto the end of the optical fiber pigtail.

In general, according to another aspect, the invention can also be characterized as a process for beam combination in a multi-beam laser system. As such, the invention comprises generating multiple beams from a multi-stripe laser chip. At least some of the beams have their polarizations subsequently rotated to enable spatial merging using a birefringent material. The merged beam is then coupled into an optical fiber.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
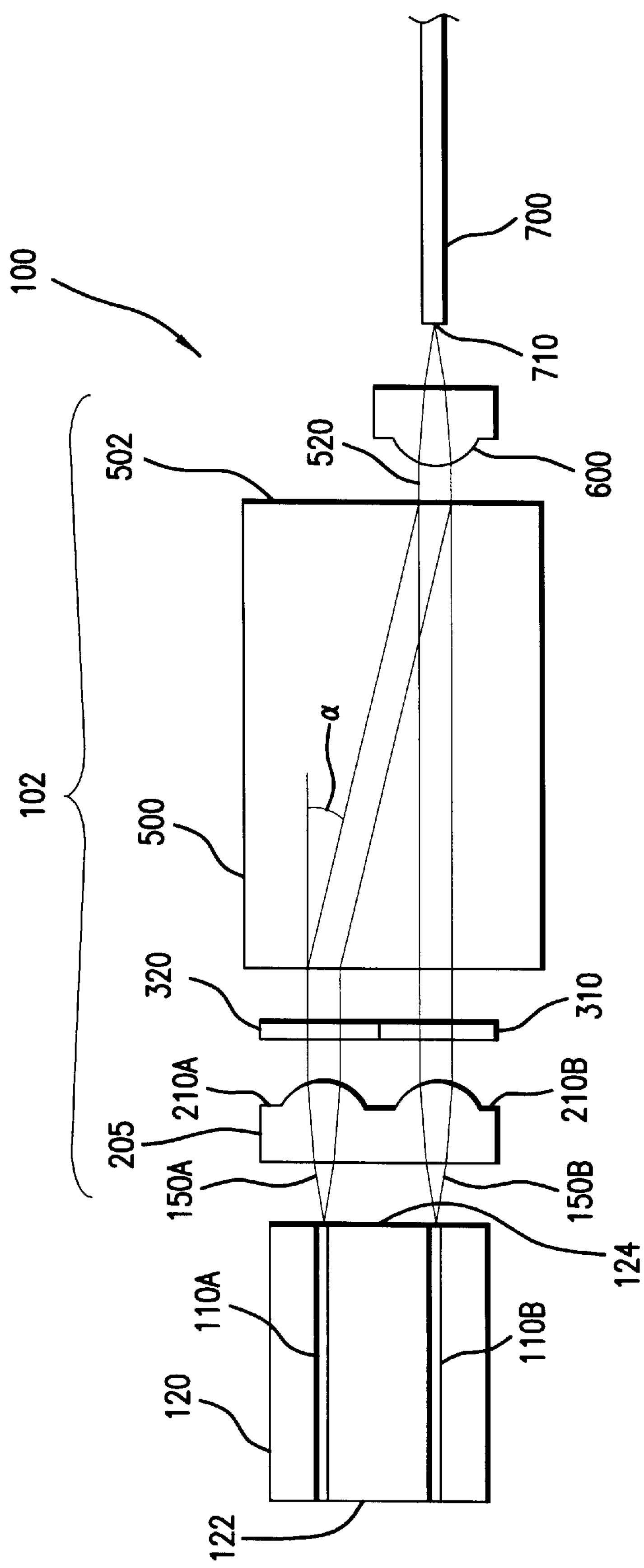
FIG. 1 is a top plan, schematic view illustrating a laser system with a multi-stripe diode chip and beam combiner.

FIG. 1 shows a laser system 100 with a multi-stripe diode laser chip 120 and beam combiner 102, which has been constructed according to the principles of the present invention.

Specifically, the light is generated by a semiconductor diode chip 120. The chip has multiple stripes 110A, 110B or ridge waveguides fabricated in it. Each stripe produces a, typically diverging, beam 150A, 150B.

In the preferred embodiment, the chip 120 has a highly reflective rear facet 122, i.e., providing greater than 90% power reflectivity. Other configurations, however, are possible such as a Fabry-Perot configuration in which the rear facet 122 is anti-reflection coated and a grating or other cavity device is provided behind the rear facet 122. Alternatively, such in other configurations, the grating is located in front of the chip, before or after the combiner.

The chip preferably has a low reflectivity front facet 124. Typically, in pump applications, the front facet power reflectivities of 2–10% are used.

To address beam divergence, an optical collimation structure 205 is used to counteract the divergence and improve the collimation of beams 150A, 150B. A single cylindrical lens, for example, could be used. In the preferred embodiment, however, the collimation optical structure 205 comprises oval or circular microlenses 210A, 210B that fully collimate the beams 150A, 150B. Preferably, these are lenses formed on a single substrate of the optical structure 205 utilizing mass-transport processes as described in U.S. Pat. No. 5,618,474, which is incorporated herein by this reference in its entirety.

The formation of the two microlenses on a single substrate utilizing a photolithographically-controlled process is an important enabling technology and aspect of the invention. The transverse spacing between the stripes, and thus the beams, is known since lithographic processes form the stripes during fabrication of the chip 120. This center-to-center ridge spacing is then used as the center-to-center spacing in the lithographic formation of the microlenses 210A and 210B. Thus, lens spacing is not a variable in the installation process of the optical collimation structure 205.

The two beams 150A, 150B are typically polarized parallel to each other as they emerge from the ridges 110A, 110B of the chip 120. In the preferred embodiment, a polarization rotator is also provided in the optical path to rotate a polarization of some of the multiple beams such that the beams have different polarizations with respect to each other.

The preferred implementation of the polarization rotator is a half-wave plate, which has been installed in one of the paths for the beams 150A, 150B. In the illustrated implementation, the half-wave plate 320 is installed in the path of beam 150A. This rotates the plane of polarization of beam 150A by 90°.

A plain substrate 310 or no substrate is placed in the path of the second beam 150B. The plane of polarization of beam 150B is thus unchanged. The phase delay of the two beams is equalized if the plain substrate is used.

One challenge to this embodiment is a fabrication of a thin half-wave plate that can be inserted into only one beam at a location that is optically upstream of the birefringent plate or material. Preferably, the plate has very low loss and has a sharp edge, i.e., the edge of the plate has a high optical quality. In the preferred embodiment, the half-wave plate 320 is constructed from quartz crystal in the zero order. The plate is thus about 60–90 micrometers thick for 980 nm radiation.

The beams 150A, 150B enter the birefringent material 500. In the illustrated implementation, the nonrotated beam 150B passes, without deviation, through the birefringent material 500, while the rotated beam 150A propagates at an angle ($\alpha$). Various bifringent materials provides the necessary merging, such as rutile and calcite, for example.

The length or thickness of the birefringent material is selected so that the two beams overlap at the second face 502 of the plate 500. When the two constituent beams exit from the block of birefringent material 500, they are redirected to be parallel to the input direction to thereby form a merged beam 520.

The merged beam 520 emerging from the birefringent material 500 comprises the two collinear beams with orthogonal polarizations with respect to each other.

The merged beam 520 is focused by optical focusing structure onto the core at the end 710 of an optical fiber 700. In the preferred embodiment, the optical focusing structure comprises a discrete circular or oval lens 600 formed by the mass-transport process. In alternative embodiments, fiber lens systems are fabricated on the end 710 of the fiber 700, in place of a cleaved end-surface, to improve coupling efficiency either in addition to or in place of the discrete lens. In still other embodiments, the curvature of the collimation lens 210A, 210B are selected to generate a focussed beam at the end of the fiber.

The optical fiber 700 is preferably single mode optical fiber. While a many solutions exist for coupling light into the core of relatively-large multimode fiber, coupling into single mode fiber requires the precise focusing attainable with the present illustrated embodiment due to the much smaller core cross-section.

The polarization characteristics of the merged beam make the present invention particularly relevant to Raman pumping applications, which require a non-polarized beam. In the present case, the merged beam 520 has balanced orthogonal states of polarization.

Figure 2:
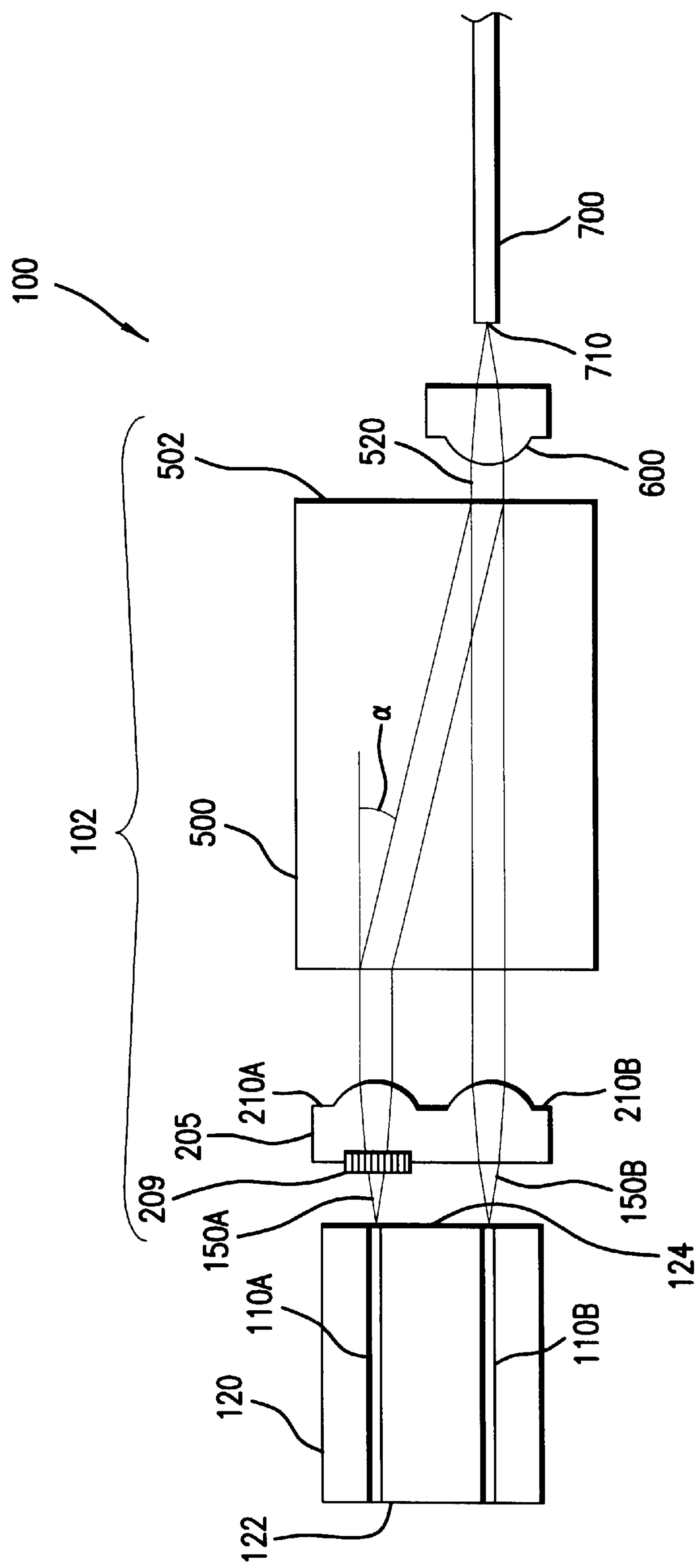
FIG. 2 is a top plan, schematic view of another embodiment of the inventive laser system using a sub-wavelength grating to perform beam rotation.

FIG. 2 illustrates an alternative configuration in which a sub-wavelength period grating 209, instead of a half-wave plate, functions to rotate the polarization of one of the beams 150A, 150B. In the preferred embodiment, the grating is etched, or otherwise formed, onto a side of the substrate of the optical collimation structure 205. Such gratings, as described in *Applied Physics Letters* 42 (6), Mar. 15, 1983, page 492, do not diffract the light, but instead, operate as a homogenous birefringent material.

In still other embodiments the polarization rotation is performed by liquid crystal, preferably in photopolymerizable polymer utilizing photoalignment.

Figure 3:
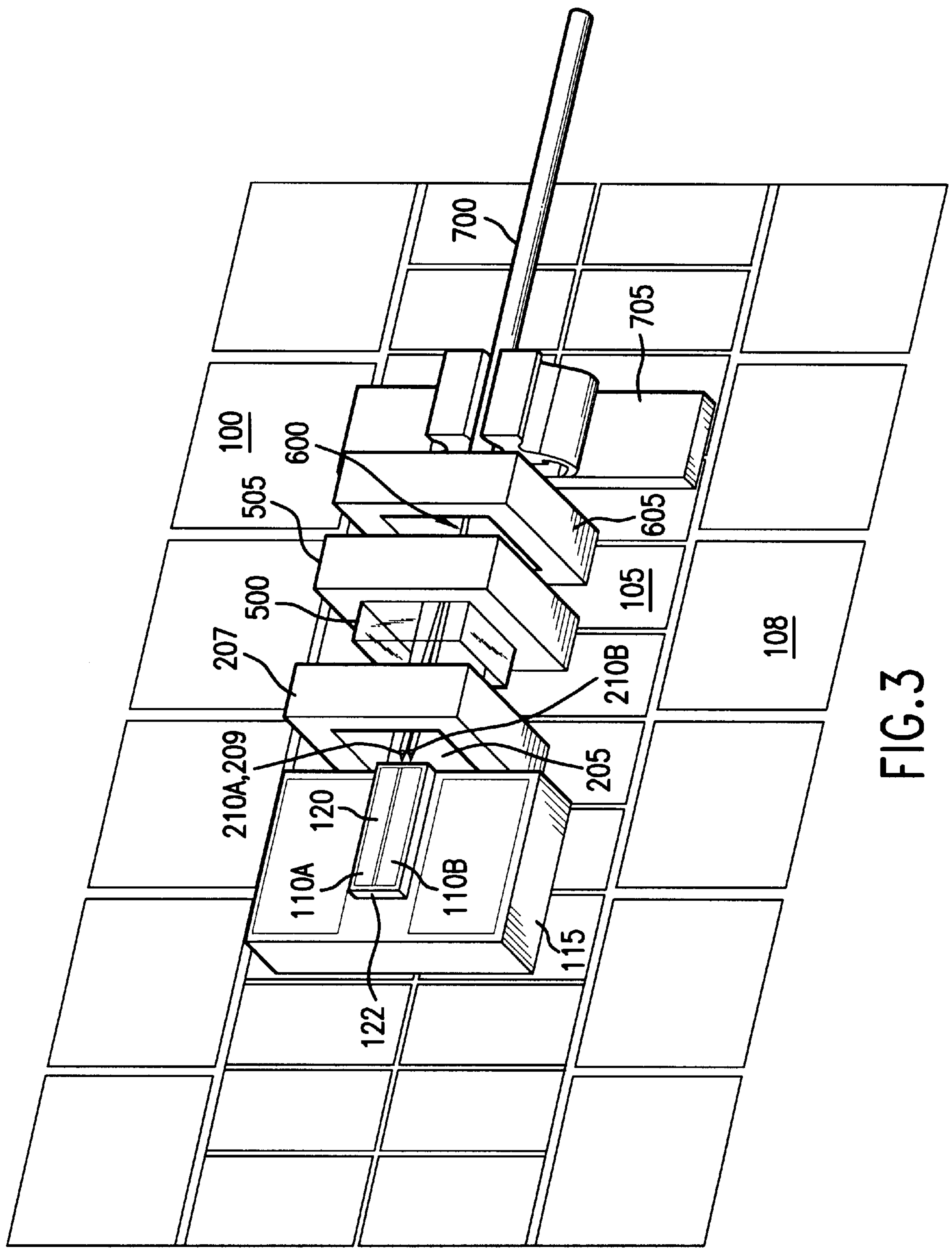
FIG. 3 is a perspective view of the laser system, illustrating its integration on a single optical bench in a module.

FIG. 3 illustrates the integration of the second embodiment of the laser system 100 on a single optical bench 105 in a laser system module 108. Specifically, the multi-stripe laser chip 120 is attached to a submount 115, which provides temperature control and electrical connections.

The collimation optical structure-subwavelength grating combination 205 is held on a first frame or mount 207, which is attached to the optical bench 105 via bonding process such as solder bonding, or laser welding. In the preferred embodiment, eutectic solder bonding is used. Although in other systems, the substrate of the structure 205 is bonded directly to the optical bench. The birefringent plate 500 is supported on a second mount 505, or alternatively is bonded directly to the bench 105. The focusing lens substrate 600 is supported on a third mount 605 or bench bonded. Finally, the optical fiber 700 is also secured to the optical bench 105 via an alignment and mounting structure 705.

Of course, in the case of the first embodiment, the half-wave plate 320 is added between the optical structure 205 and bifringent material 500. In one implementation, the half-wave plate is attached to one of the frames illustrated in FIG. 3, such as frame 207 or 505. In other implementations, another frame is used to support the plate.

Figure 4:
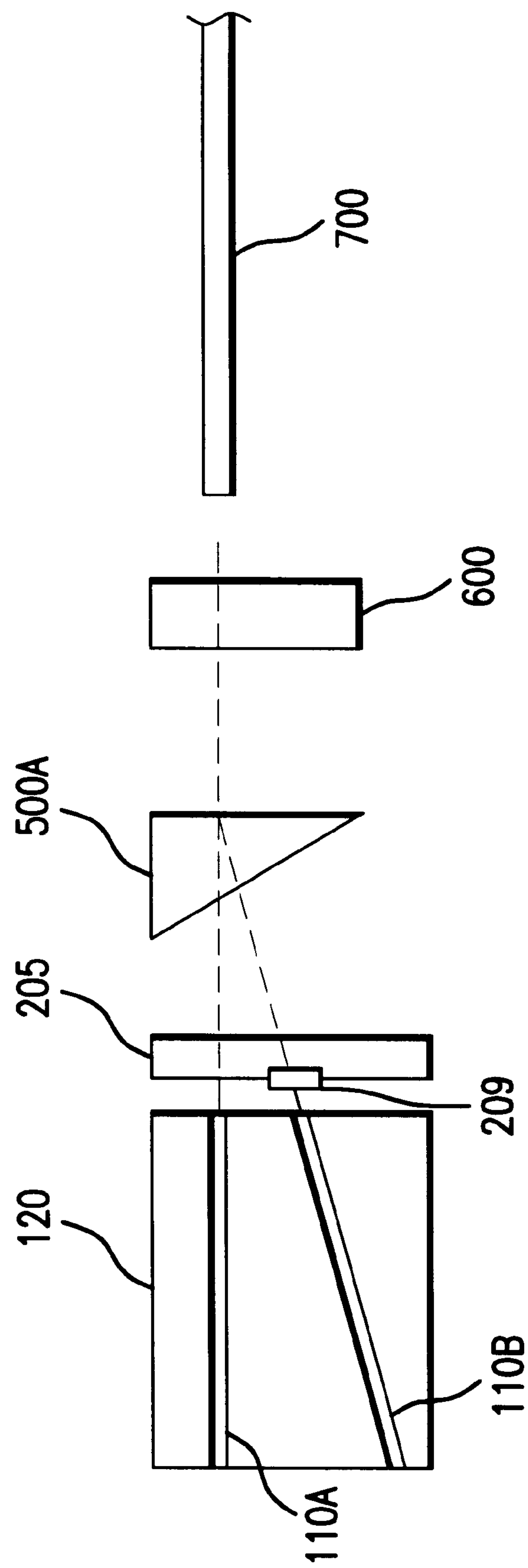
FIG. 4 is a schematic top plan view of a third embodiment of the present invention.

FIG. 4 shows a third embodiment of the present invention. Rather than a rectangular bifringent plate as shown in FIGS. 1 and 2, this embodiment utilizes a wedge-shaped plate of bifringent material 500A to spatially merge the converging beams from the laser chip 120. Such converging beams are generated by the illustrated non-parallel stripes 110A, 110B or tilted facets, in other chip configurations.

The following is the assembly/alignment sequence for the system 100 illustrated in FIG. 3:

First, the dual stripe laser 120 is installed on submount 115 and then submount/laser is installed onto bench 105. Contemporaneously, the collimation optical structure 205, focusing structure 605, and the fiber alignment structure 705, without fiber 700, are installed on the bench 105.

Next, wire-bonding is performed to laser 122.

A large multi-mode fiber is then placed in fiber alignment structure 705 and connected to a detector and the laser 122 is energized.

While monitoring the strength of the signal received by the detector, the relative positions of the laser 122 and collimation and focusing structures 205, 605 are adjusted to maximize signal coupled into fiber.

When the signal maximum is detected, the multimode fiber is replaced with single mode fiber pigtail 700 and the half-wave plate 320 if used is installed.

Finally, the position of collimation and focusing structures 205, 605 is readjusted to maximize coupling into fiber 700.

While this invention has been particularly shown and described with references to preferred embodiments thereof, it will be understood by those skilled in the art that various changes in form and details may be made therein without departing from the scope of the invention encompassed by the appended claims.

What is claimed is:

1. A laser system comprising:

an optical bench;

a laser device connected to the optical bench that emits multiple beams;

a birefringent material, connected to the optical bench, for spatially merging beams from the laser device; and an optical fiber, connected to the optical bench, for receiving and transmitting a merged beam.

2. A laser system as claimed in claim 1, further comprising a polarization rotator, connected to the optical bench, which rotates a polarization of some of the multiple beams, such that the beams have a different polarization with respect to each other prior to transmission through the birefringent material.

3. A laser system as claimed in claim 2, wherein the polarization rotator comprises a half-wave plate.

4. A laser system as claimed in claim 2, wherein the polarization rotator comprises a sub-wavelength period grating.

5. A laser system as claimed in claim 1, wherein the laser device comprises a single, multi-stripe laser diode chip, each stripe emitting one beam.

6. A laser system as claimed in claim 5, further comprising a polarization rotator, connected to the optical bench, which rotates a polarization of one of the multiple beams.

7. A laser system as claimed in claim 1, wherein the laser device comprises a laser diode chip having two stripes, each stripe emitting one of two beams.

8. A laser system as claimed in claim 1, further comprising collimation optics that is optically interposed between the laser device and the birefringent material and that counteracts divergence in the beams.

9. A laser system as claimed in claim 8, wherein the collimation optics comprise microlenses held by a frame, which is attached to the optical bench.

10. A laser system as claimed in claim 9, further comprising a sub-wavelength period grating, formed on one of the microlenses, to rotate a polarization of one of the beams prior to transmission through the birefringent material.

11. A laser system as claimed in claim 1, further comprising a coupling system for coupling the merged beam into the optical fiber.

12. A laser system as claimed in claim 11, wherein the coupling system comprises focusing optics that focus the merged beam from birefringent material onto an end of the optical fiber.

13. A laser system comprising:

a multistripe laser diode chip, each stripe emitting a beam, a birefringent material for spatially merging beams from the laser diode chip; and an optical fiber, connected to the optical bench, for receiving and transmitting the merged beam.

14. A laser system as claimed in claim 13, further comprising a polarization rotator, connected to the optical bench, which rotates a polarization of one of the beams from the chip such that the beams have a different polarization with respect to each other prior to transmission through the birefringent material.

15. A laser system as claimed in claim 14, wherein the polarization rotator comprises a half-wave plate.

16. A laser system as claimed in claim 14, wherein the polarization rotator comprises a sub-wavelength period grating.

17. A laser system comprising:

a multistripe laser diode chip, each stripe emitting a beam, means for spatially merging beams from the laser diode chip; and means for receiving and transmitting the merged beam.

18. A beam combination process for a multi beam laser system generating multiple beams from a multi-stripe laser chip;

rotating polarizations of at least some of the beams;

spatially merging the beams using a birefringent material; and coupling the merged beam into an optical fiber.

19. A process as claimed in claim 18, further comprising improving a collimation of the beams prior to spatially merging the beams.

20. A process as claimed in claim 18, wherein the step of coupling the merged beam comprises focussing the merged beam onto an end of the fiber.

21. A laser system as claimed in claim 1, wherein the beams enter the birefringent material displaced from each other and exit the birefringent material overlapping each other.

22. A laser system as claimed in claim 13, wherein the beams enter the birefringent material displaced from each other and exit the birefringent material overlapping each other.

* * * * *